(12) United States Patent
Kim

(10) Patent No.: US 7,230,433 B2
(45) Date of Patent: Jun. 12, 2007

(54) CONNECTOR TEST DEVICE

(75) Inventor: Il Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 11/281,150

(22) Filed: Nov. 17, 2005

(65) Prior Publication Data
US 2006/0105604 A1    May 18, 2006

(30) Foreign Application Priority Data
Nov. 17, 2004    (KR) ...................... 10-2004-0094085

(51) Int. Cl.
*G01R 31/04* (2006.01)
(52) U.S. Cl. ...................... 324/538; 439/587
(58) Field of Classification Search ................ 324/538; 439/587
See application file for complete search history.

(56) References Cited

U.S. PATENT DOCUMENTS 5,877,622 A * 3/1999 Aoyama et al. ......... 324/158.1
6,612,021 B1 * 9/2003 Taniguchi et al. ............ 29/748

FOREIGN PATENT DOCUMENTS

| GB | 21131633 A | * | 6/1984 |
| JP | 64-083163 | | 3/1989 |
| JP | 03-245068 | | 10/1991 |
| JP | 09-043298 | | 2/1997 |
| JP | 2001-332370 | | 11/2001 |
| JP | 2004-037164 | | 2/2004 |

* cited by examiner

*Primary Examiner*—Walter Benson
(74) *Attorney, Agent, or Firm*—Morgan Lewis & Bockius LLP

(57) ABSTRACT

The present invention provides a connector test device. The device includes a test jig which has a conductive test pin to detect whether a conductive pin of a connector is appropriately connected to the conductive test pin or not, and a moving pin and a test terminal to detect whether a waterproof pin of the connector is appropriately installed in the connector or not. The device simultaneously displays the electricity conduction states between the conductive pin and the conductive test pin and between the moving pin and the test terminal. The device easily and accurately measures the installed states of both the conductive pin and the waterproof pin provided in the connector.

9 Claims, 3 Drawing Sheets

CONNECTOR TEST DEVICE

CROSS-REFERENCE TO RELATED APPLICATIONS

The present application is based on, and claims priority from, Korean Application Serial Number 10-2004-0094085, filed on Nov. 17, 2004, the disclosure of which is hereby incorporated by reference herein in its entirety.

FIELD OF THE INVENTION

The present invention relates to devices for testing the quality of signal transmitting connectors and, more particularly, to a connector test device for testing the operational quality of connectors used for transmitting signals to or from electronic devices, such as ECUs (Engine Control Units) or PCTs (Power-train Control Units).

BACKGROUND OF THE INVENTION

FIG. 1 illustrates the construction of a conventional connector 1 which is the object to be tested using the connector test device of the present invention.

As shown in the drawing, the connector 1 includes a connector body having a plurality of holes formed through the connector body, with a plurality of conductive pins 3 inserted into some of the plurality of holes. An electric wire extends from each of the conductive pins 3.

An opposite connector (not shown), which is a second connector, is connected to the lower end of the abovementioned connector 1 which is a first connector. The second connector has a plurality of conductive pins at positions corresponding to the conductive pins 3 of the first connector 1. The conductive pins of the first and second connectors each have an engaging slot, which is not shown in detail in the drawings and into which an associated conductive pin of an opposite connector is inserted.

The surface of each connector, which faces the opposite connector and is connected to the opposite connector, is referred to herein as a "connecting surface" of the connector.

The position and number of conductive pins inserted into the holes of a connector may be variously determined in accordance with the use of the connector. Thus, empty holes having no conductive pins remain in the connector. Moisture or foreign substances may be introduced into the empty holes having no conductive pins. To prevent such introduction of moisture or foreign substances into the holes, the empty holes must be closed. For example, nonmetallic waterproof pins 5 have been generally used to close the empty holes and prevent the introduction of such moisture or foreign substances into the holes.

SUMMARY OF THE INVENTION

Embodiment of present invention provides a connector test device for automatically and simultaneously determining a state of conductive pins installed in a connector to transmit electric signals and a state of waterproof pins installed in the connector to prevent the introduction of foreign substances into empty holes of the connector.

A connector test device according to an exemplary embodiment of the present invention includes a test jig having a pin support part to form an opposite surface opposite a connecting surface of a connector. A conductive test pin perpendicularly protrudes from the opposite surface of the pin support part so as to be connected to a conductive pin of the connector. A moving pin perpendicularly protrudes from the opposite surface of the pin support part so as to be connected to a waterproof pin of the connector. The moving pin penetrates the pin support part and linearly moves in the connecting direction of the connector. A test terminal is provided to come into contact with the moving pin in response to movement of the moving pin in the connecting direction of the connector. An input/output board detects whether electricity is conducted between the moving pin and the test terminal and between the conductive pin of the connector and the conductive test pin. A display means visually displays the electricity conduction states between the moving pin and the test terminal and between the conductive pin of the connector and the conductive test pin. A control circuit controls the input/output board and operates the display means using information output from the input/output board.

BRIEF DESCRIPTION OF THE DRAWINGS

For a better understanding of the nature and objects of the present invention, reference should be made to the following detailed description with the accompanying drawings, in which.

DETAILED DESCRIPTION OF THE PREFERRED EMBODIMENTS

Herein below, a preferred embodiment of the present invention will be described with reference to the accompanying drawings. For ease of description, the connector 1, illustrated in FIGS. 2 and 3, includes one conductive pin 3 and one waterproof pin 5. However, it should be understood that the connector may include a plurality of conductive pins and a plurality of waterproof pins.

Figure 1:
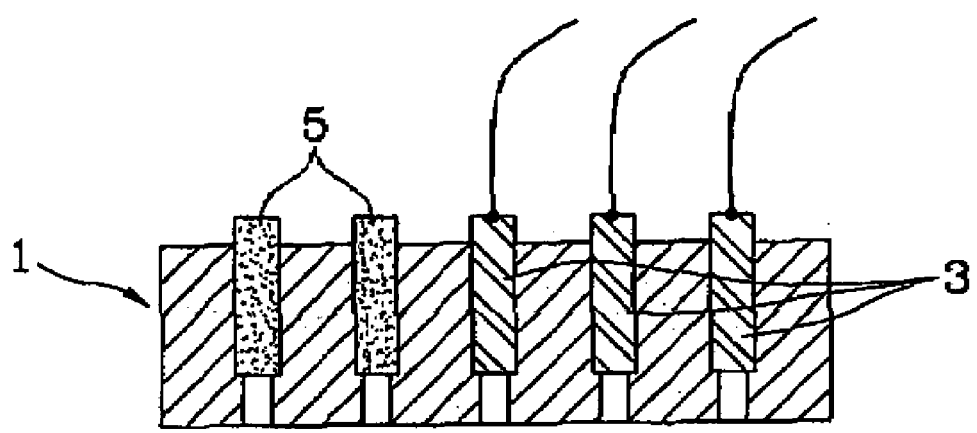
FIG. 1 illustrates a connector to be tested using a connector test device according to the present invention.
Figure 2:
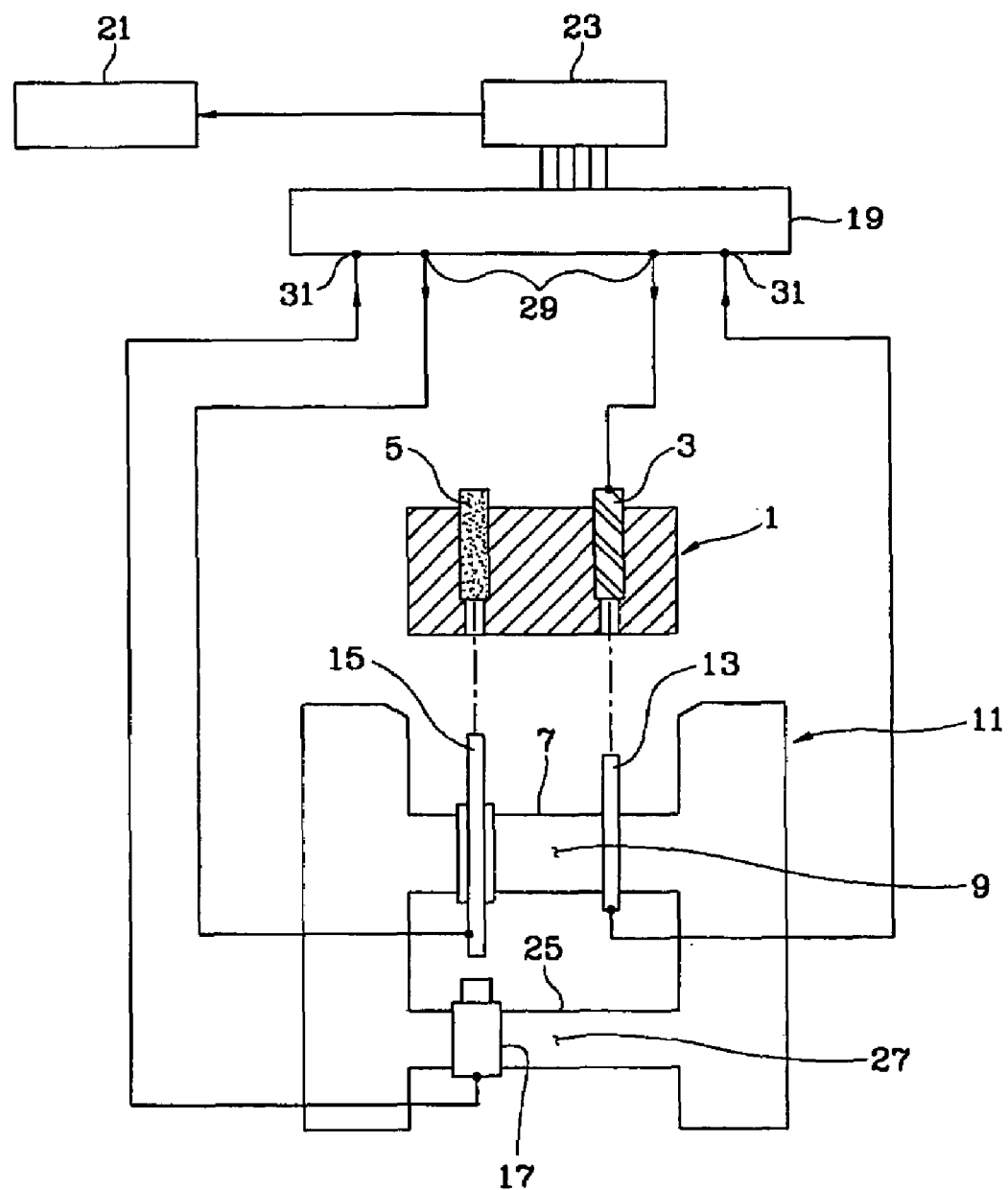
FIGS. 2 and 3 illustrate the connector test device according to an embodiment of the present invention before and after the connector test.
Figure 3:
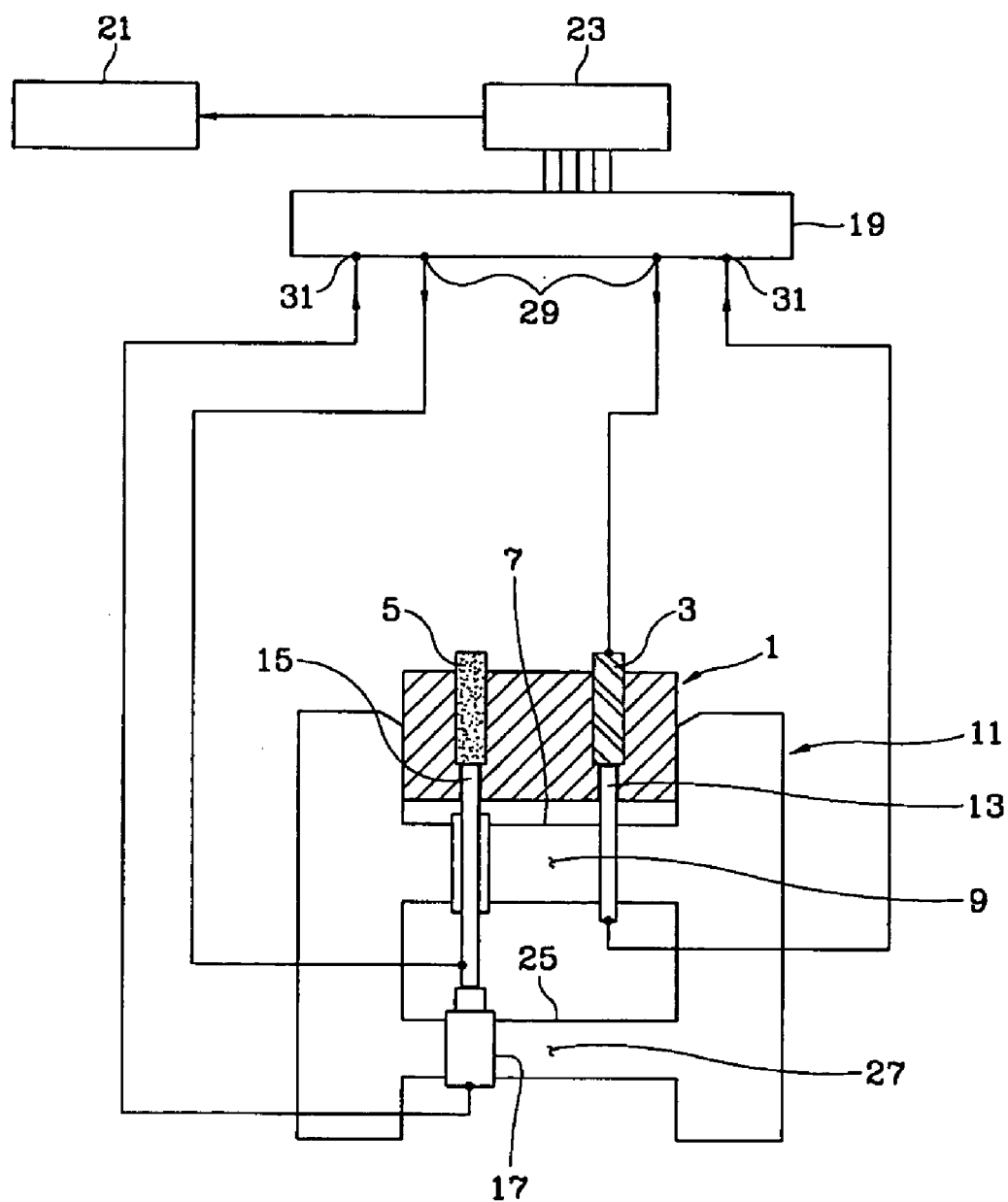

As illustrated in FIGS. 2 and 3, the connector test device according to the embodiment of the present invention includes a test jig 11, which has a pin support part 9 to form an opposite surface 7 opposite a connecting surface of a connector 1 to be tested. A conductive test pin 13 perpendicularly protrudes from the opposite surface 7 of the pin support part 9 such that the conductive test pin 13 can be connected to a conductive pin 3 of the connector 1. A moving pin 15 perpendicularly protrudes from the opposite surface 7 of the pin support part 9 such that the moving pin 15 can be connected to a waterproof pin 5 of the connector 1. The moving pin 15 penetrates the pin support part 9 and linearly moves in the connecting direction of the connector 1. A test terminal 17 is placed such that the test terminal 17 can come into contact with the moving pin 15 in response to movement of the moving pin 15 in the connecting direction of the connector 1. An input/output board 19 detects whether electricity is conducted between the moving pin 15 and the test terminal 17 and between the conductive pin 3 of the connector 1 and the conductive test pin 13. A display means 21 visually displays the electricity conduction states between the moving pin 15 and the test terminal 17 and between the conductive pin 3 of the connector 1 and the conductive test pin 13. A control circuit 23 controls the input/output board 19 and operates the display means 21 using information data output from the input/output board 19.

The conductive test pin 13 is securely mounted to the pin support part 9 and is connected to the conductive pin 3 of the connector 1 to be tested, thus transmitting electric signals to the conductive pin 3.

The moving pin 15 is elastically biased towards the connector 1 to be tested. The moving pin 15 is constructed such that, when the connector 1 is moved towards the test jig 11 and the waterproof pin 5 pushes the moving pin 15, the moving pin 15 can penetrate the pin support part 9 and can linearly move in the connecting direction of the connector 1. The above-mentioned moving pin is well-known to those killed in the art, and further explanation of the construction of the moving pin is thus not deemed necessary.

The test jig 11 includes a detection part 27 which has a detecting surface 25 parallel to the opposite surface 7 of the pin support part 9. The test terminal 17 is placed in the detection part 27.

The input/output board 19 outputs electric signals to the moving pin 15 and the conductive pin 3 through output terminals 29 that are respectively connected to the moving pin 15 and the conductive pin 3. The input/output board 19 receives electric signals from the test terminal 17 and the conductive test pin 13 through input terminals 31 that are respectively connected to the test terminal 17 and the conductive test pin 13.

The display means 21 may comprise a monitor, and the control circuit 23 may comprise a personal computer or other processor based control unit. Furthermore, the display means 21, control circuit 23 and input/output board 19 may be substituted with a plurality of LEDs (light emitting diodes) or a plurality of lamps, which is arranged to be turned on by switching operations between the moving pin 15 and the test terminal 17 and between the conductive pin 3 and the conductive test pin 13.

The connector test device having the above-mentioned construction according to the embodiment of the present invention is operated as follows.

FIG. 2 illustrates the connector 1 to be tested, which is not engaged with the test jig 11, so that, even if the output terminals 29 of the input/output board 19 output electric signals, no signal is input through the input terminals 31.

When the connector 1 is moved in the connecting direction of the connector 1, the connector 1 is brought into engagement with the test jig 11 as shown in FIG. 3. As the connector 1 is moved in the connecting direction, the moving pin 15 comes into contact with the waterproof pin 5. Thus, the moving pin 15 is pushed by the waterproof pin 5 and is brought into contact with the test terminal 17. Therefore, electricity can be conducted between the moving pin 15 and the test terminal 17, so that the input/output board 19 can detect an electric signal, which has been output from the output terminal 29 to the moving pin 15 and is input by the input terminal 31 through the test terminal 17.

Furthermore, when the connector 1 is engaged with the test jig 11 as described above, the conductive pin 3 of the connector 1 is connected to the conductive test pin 13, so that electricity can be conducted between the conductive pin 3 and the conductive test pin 13. Thus, the input/output board 19 can detect an electric signal, which has been output to the conductive pin 3 and is input through the conductive test pin 13.

The control circuit 23 controls the input/output board 19 so that the input/output board 19 outputs electric signals to the moving pin 15 and the conductive pin 3 and detects whether the output signals are returned to the board 19 through the test terminal 17 and the conductive test pin 13. The control circuit 23 visually displays the states of both the waterproof pin 5 and the conductive pin 3 of the connector 1 by means of the display means 21. Thus, a person can conveniently and accurately learn the state of the connector 1 while testing the state of the connector 1.

As apparent from the foregoing, there is an advantage in the present invention in that the installed states of the conductive pins and the waterproof pins of a connector can be easily and accurately determined.

What is claimed is:

1. A connector test device comprising:
   a test jig having a pin support part to form an opposite surface opposite a connecting surface of a connector;
   a conductive test pin perpendicularly protruding from the opposite surface of the pin support part so as to be connected to a conductive pin of the connector;
   a moving pin perpendicularly protruding from the opposite surface of the pin support part so as to be connected to a waterproof pin of the connector, the moving pin penetrating the pin support part and linearly moving in a connecting direction of the connector;
   a test terminal provided to come into contact with the moving pin in response to movement of the moving pin in the connecting direction of the connector;
   an input/output board to detect whether electricity is conducted between the moving pin and the test terminal and between the conductive pin of the connector and the conductive test pin;
   display means for visually displaying electricity conduction states between the moving pin and the test terminal and between the conductive pin of the connector and the conductive test pin; and
   a control circuit to control the input/output board and operate the display means using information output from the input/output board.

2. The connector test device as defined in claim 1, wherein said test jig is provided with a detection part that has a detecting surface parallel to the opposite surface of the pin support part, with the test terminal placed in the detection part.

3. The connector test device as defined in claim 1, wherein said display means comprises a monitor.

4. The connector test device as defined in claim 1, wherein said display means comprises a plurality of LEDS.

5. The connector test device as defined in claim 1, comprising a plurality of said moving pins.

6. The connector test device as defined in claim 1, comprising a plurality of said conductive test pins.

7. A connector test device, comprising:
   a test jig having a pin support part with an opposite surface configured and dimensioned to oppose a connecting surface of a connector;
   at least one conductive test pin perpendicularly protruding from said opposite surface and configured and dimensioned for connection to a conductive pin of the connector;
   at least one moving pin perpendicularly protruding from said opposite surface and being movable in a connecting direction of the connector, said moving pin configured and dimensioned for connection to a waterproof pin of a connector;
   a test terminal disposed for contact with the moving pin in response to movement of the moving pin in the connecting direction of the connector; and an input/output board to detect whether electricity is conducted between the moving pin and the test terminal and between the conductive pin of the connector and the conductive test pin.

8. The connector test device as defined in claims 7, further comprising:
    display means for visually displaying electricity conduction states between the moving pin and the test terminal and between the conductive pin of the connector and the conductive test pin; and a control circuit to control the input/output board and operate the display means using information output from the input/output board.

9. The connector test device as defined in claim 7, wherein said test jig includes a detection part having a detecting surface parallel to said opposite surface with the test terminal disposed in the detection part.

* * * * *